United States Patent [19]

Chiu et al.

[11] Patent Number: 5,407,531

[45] Date of Patent: Apr. 18, 1995

[54] METHOD OF FABRICATING A COMPOUND SEMICONDUCTOR DEVICE

[75] Inventors: Tien-Heng Chiu, Spotswood; Won-Tien Tsang, Holmdel, both of N.J.

[73] Assignee: AT&T Corp., Murray Hill, N.J.

[21] Appl. No.: 196,930

[22] Filed: Feb. 15, 1994

[51] Int. Cl.$^6$ ............................................. H01L 21/00
[52] U.S. Cl. ................................. 156/650; 156/652; 156/646; 156/662; 437/228
[58] Field of Search ..................... 437/228, DIG. 964; 156/662, 650, 652, 646

[56] References Cited

U.S. PATENT DOCUMENTS

| | | | |
|---|---|---|---|
| 4,975,252 | 12/1990 | Nishizawa et al. | 422/245 |
| 5,037,775 | 8/1991 | Reisman | 437/89 |
| 5,201,995 | 4/1993 | Reisman et al. | 156/646 |

FOREIGN PATENT DOCUMENTS

| | | |
|---|---|---|
| 56-169331 | 12/1981 | Japan . |
| 60-211824 | 10/1985 | Japan . |
| 61-139686 | 6/1986 | Japan . |

OTHER PUBLICATIONS

C. Caneau et al., "Etching of InP by HCl in an OMVPE Reactor", 1991, pp. 203–208, Journal of Crystal Growth 107 (1991).

H. J. Osten et al., "Surfactant-Mediated Growth of Germanium on Si(100) by MBE and SPE:", 1993, pp. 396–400, Journal of Crystal Growth 127 (1993).

*Primary Examiner*—R. Bruce Breneman
*Assistant Examiner*—George Goudreau

[57] ABSTRACT

A device fabrication method includes an etching step for compound III/V semiconductor materials such as gallium arsenide or indium phosphide. The step is carried out in the chamber of a growth reactor under conditions that are compatible with a subsequent growth step performed in the same reactor. Specifically, etching is performed in a so-called pulsed mode wherein each etching interval is followed by an interval in which etching is interrupted. Moreover, a Group III species such as indium is introduced into the chamber during each etching interval to enhance the smoothness of the etched surface.

17 Claims, 1 Drawing Sheet

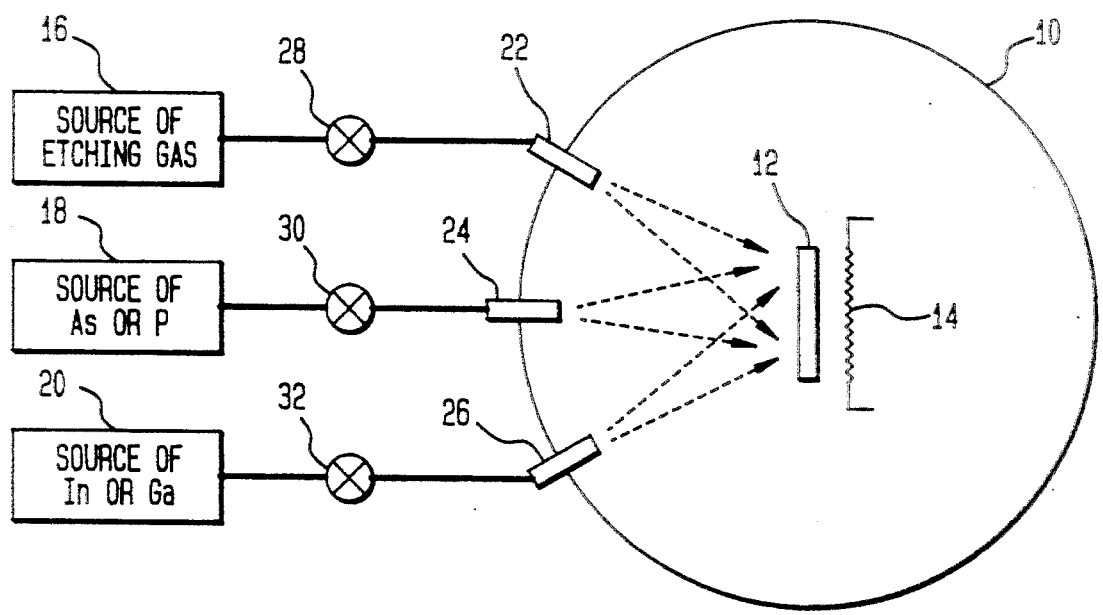

METHOD OF FABRICATING A COMPOUND SEMICONDUCTOR DEVICE

BACKGROUND OF THE INVENTION

This invention relates to a method of making a compound semiconductor device and, more particularly, to a device fabrication method that includes etching material from the surface of a III/V semiconductor body by exposure to a reactive chemical medium.

In many semiconductor device fabrication sequences of practical importance, it is often necessary or at least advantageous to etch an exposed surface before depositing a layer on the surface. Illustratively, this is done before an epitaxial layer is formed on the surface of a III/V semiconductor which is to be used to fabricate electronic or optical devices. Such etching is effective to remove contaminants from the surface on which growth is to occur, thereby helping to ensure that the grown layer will be of good quality and that the resulting device will accordingly exhibit specified characteristics.

To enhance throughput and to minimize the chance of contaminating the etched (cleaned) surface, it is advantageous in a device fabrication sequence to contemplate carrying out successive etching and growth steps in situ in the same reactor. And, in fact, attempts have been reported to successively etch and grow III/V semiconductor material in situ in the chamber of a conventional growth reactor.

Chemical beam epitaxy (CBE) is a known and particularly versatile technique for growing an epitaxial layer on the surface of a single-crystal semiconductor substrate. In a CBE process, appropriate chemicals in gaseous form are introduced into a chamber and directed onto a heated semiconductor surface to produce an epitaxial layer on the surface, as is well known in the art.

Heretofore, attempts have been made to successively etch and grow III/V semiconductor material in situ in the chamber of, for example, a CBE growth reactor. But many of these attempts have been found to be deficient in the respect that known etching techniques compatible with growth conditions employed in the reactor do not usually produce etched surfaces that are sufficiently smooth. In particular, the surface roughness caused by the in situ etching process often makes the surface unacceptable for subsequent growth purposes.

Thus, it was recognized that a need existed for an improved device fabrication sequence that included an etching technique that could be carried out in a reactor under conditions compatible with a subsequent growth step performed in the same reactor. In particular, a need existed for an etching technique that could be so utilized to etch compound semiconductor materials. Specifically, it was apparent that such a technique, if available, could help to lower the cost and improve the quality of a variety of III/V semiconductor devices of practical importance.

SUMMARY OF THE INVENTION

In accordance with the principles of the present invention, a device fabrication method includes an etching step for III/V semiconductor materials. Importantly, the step is carried out in the chamber of a growth reactor under conditions that are compatible with a subsequent growth step performed in the same reactor.

In one specific illustrative embodiment of the invention, the surface of a III/V compound semiconductor substrate is etched in a chamber by a reactive gaseous chemical medium that comprises active chlorine as the etchant species. Etching is carried out in a so-called pulsed mode wherein each interval in which the etchant species is introduced into the reactor is followed by an interval in which the supply of etchant species into the reactor is interrupted. During each interruption, surface migration of the Group III species in the compound semiconductor is effective to smooth the surface of the substrate. Moreover, in accordance with the invention, a Group III species is introduced into the chamber during each etching interval. The introduction of this species enhances the smoothness of the etching process.

BRIEF DESCRIPTION OF THE DRAWING

A complete understanding of the present invention and of the above and other features and advantages thereof may be gained from a consideration of the following detailed description presented hereinbelow in connection with the accompanying single-figure drawing which represents in simplified schematic form a portion of a specific illustrative system adapted to carry out etching in accordance with the principles of the present invention.

DETAILED DESCRIPTION

The specific illustrative system depicted in the drawing includes a standard chamber 10 of a conventional reactor. Illustratively, the depicted system comprises a CBE reactor. A workpiece 12 to be processed is mounted within the chamber 10. At least the left-hand or front surface of the workpiece 12 comprises a III/V compound semiconductor material. By way of a specific illustrative example, the surface material is assumed to comprise gallium arsenide (GaAs) or indium phosphide (InP).

Etching carried out in accordance with this invention can be applied in a blanket fashion to an entire unmasked surface or it can be applied in a selective way only to particular unmasked portions of a patterned surface. In the latter case, a patterned layer of, for example, silicon dioxide constitutes a suitable etch-resistant material for selectively masking a III/V semiconductor material.

In accordance with the invention, the initially smooth but perhaps contaminated left-hand surface of the workpiece 12 is etched in preparation for a subsequent growth step. Illustratively, this subsequent step comprises growing an epitaxial layer on the etched surface. Significantly, the inventive etching step is carried out in a manner that removes contaminants while leaving the etched surface with an extremely planar mirror-like finish on which a high-quality epitaxial layer can be subsequently grown.

The CBE reactor shown in the drawing includes a standard heating element 14 in the chamber 10. By means of the element 14, the surface of the workpiece 12 is heated to a specified temperature for the etching and growth steps that are to be carried out in the reactor. Additionally, during etching and growth, the pressure within the chamber 10 is, illustratively, typically maintained at a value less than about 0.0001 Torr.

To carry out etching and growth, gases are introduced into the chamber 10 from sources 16, 18 and 20 via standard gas injectors 22, 24 and 26, respectively. As schematically indicated, the injectors are positioned so as to direct gases onto the left-hand surface of the workpiece 12.

Each of the three gas sources 16, 18 and 20 is connected to its respective injector via a gas line that includes therein a conventional control valve. Thus, valves 28, 30 and 32 respectively control the flow of gases from the sources 16, 18 and 20 into the chamber 10 and onto the surface of the workpiece 12.

During the etching step, the source 16 supplies a gas into the chamber 10 that is designed to etch the III/V surface of the workpiece 12. During growth, the source 18 supplies a gas that constitutes the Group V component of the semiconductor material that is to be grown on the etched surface of the workpiece 12. And the source 20 supplies, during etching, a gaseous constituent that enhances the smoothness of the etching operation and, during growth, supplies a gas that constitutes the other component of the III/V material that is to be grown on the surface of the workpiece 12.

For purposes of a specific illustrative example, it will be assumed herein that the compound III/V semiconductor material to be etched and grown in accordance with the invention comprises a (100) plane of either GaAs or InP. But it will be apparent that the inventive principles are also applicable to other III/V materials such as, for example, GaP or InAs.

It is known that active chlorine constitutes an effective etchant species for GaAs or InP. Thus, for example, in accordance with the invention, the source 16 comprises a supply of a gas such as $PCl_3$, $AsCl_3$, $Cl_2$ or HCl. Each of these gases is effective to provide the requisite etchant species.

To etch GaAs, the temperature within the chamber 10 in the vicinity of the left-hand surface of the workpiece 12 is maintained at a value in the range of about 500-to-650 degrees Celsius. For InP, a temperature range of approximately 500-to-600 degrees Celsius is maintained. For GaAs, a preferred etching temperature is about 550 degrees Celsius. For InP, a preferred etching temperature is about 520 degrees Celsius.

During the etching step, the valve 28 is controlled to allow a flow of etching gas from the source 16 into the chamber 10 via the injector 22. Illustratively, the quantity of gas supplied to the chamber 10 is adjusted to provide a workpiece etching rate of about one micrometer per hour. In practice, however, an etching rate in the range of about 0.1-to-3 micrometers per hour may be employed.

During the etching step, a gaseous constituent is also introduced into the chamber 10 from the source 20. Specifically, the source 20 is adapted to supply indium into the chamber. Illustratively, indium in gaseous form is so supplied either from trimethylindium or from a conventional elemental effusion cell. In any case, the quantity of the indium-containing gas introduced into the chamber via the injector 26 is controlled to be up to about 0.4 times (illustratively, about 0.1 times) that of the etching gas introduced into the chamber by the injector 22. The purpose of supplying indium during etching will be described in detail later below.

In accordance with the principles of the present invention, etching of the GaAs or InP workpiece 12 is carried out in a pulsed mode. Thus, for example, etching is performed, with both of the valves 28 and 32 open, for about five seconds. Then, etching is momentarily interrupted by closing the valves 28 and 32 also for a period of approximately five seconds. In practice, ON and OFF time periods in the range of about 5-to-10 seconds are satisfactory for GaAs for the aforementioned preferred processing temperature. For InP, OFF periods of about 5 seconds are satisfactory for the aforementioned preferred processing temperature. For higher processing temperatures, shorter OFF periods are utilized to avoid excessive loss of the Group V species.

Subsequent ON and OFF cycling of the etching process is repeatedly carried out until the desired thickness of the workpiece surface has been removed. Thus, for example, if it is desired to remove a total thickness of approximately 0.2 micrometers, at an etching rate of one micrometer per hour, it would be necessary to carry out an ON/OFF etching cycle that included about 144 5-second etching intervals.

During each OFF period of the aforespecified etching cycle, no additional gas is introduced into the chamber 10. The chamber temperature remains elevated during the OFF period. Therefore, some volatile atoms leave the surface of the workpiece during the OFF period. Thus, for example, for a GaAs surface, the departure of volatile arsenic atoms from the surface leaves behind gallium atoms which at this elevated temperature are relatively free to migrate along the surface of the workpiece. In turn, the migrating gallium atoms in effect fill in valleys in the surface caused by prior etching and thereby prevent or at least reduce progressive deepening of these valleys once etching is resumed. Thus, a smoothing action due to migrating gallium atoms occurs during each interruption or OFF period of the ON/OFF pulsed-mode etching cycle. (For InP, a similar smoothing action due to migrating indium atoms occurs.)

Additionally, the introduction of indium gas from the source 20 into the chamber during the ON period of each etching cycle further enhances the desired smoothing action. Thus, for example, for a GaAs surface, indium atoms so introduced tend in effect to float on the surface acting as a surfactant and not to go into the bulk of the workpiece to any substantial extent. Moreover, since indium atoms are relatively highly mobile at the high temperatures maintained in the chamber 10, even more mobile than gallium atoms, the indium atoms move along the surface relatively readily both during ON and OFF periods of the etching cycle. Such movement of indium atoms complements and enhances the aforedescribed movement of free gallium atoms in preventing or at least reducing progressive deepening of etch pits in the surface of the workpiece. Even for an InP surface, the introduction of excess indium is effective to enhance the smoothing phenomenon.

Near the end of the herein-described pulsed etching cycle, the supply of indium gas into the chamber 10 is terminated. By way of a specific illustrative example, the valve 32 controlling the supply of indium gas is turned off about two seconds before the end of the last 5-second-long etching period of the pulsed-mode cycle. In this way, excess indium atoms at the surface of the workpiece 12 are etched away before termination of the etching cycle. The final etched surface of the workpiece is thus substantially devoid of any free indium atoms.

Subsequently, before commencing a growth cycle, it is usually beneficial to introduce a Group V constituent into the chamber 10 to stabilize the surface that has just been etched. Thus, for example, for a GaAs surface, arsenic gas from the source 18 is advantageously introduced into the chamber 10 via the injector 24. During stabilization, the injected gas provides arsenic atoms that bind with any free gallium atoms that remain on the workpiece surface after etching, thereby to convert any such free gallium atoms into GaAs. Illustratively, injection of arsenic into the chamber 10 for approximately 10-to-30 seconds before growth commences is adequate to stabilize the etched surface. For an InP surface, similar stabilization after etching and before growth starts is advantageously achieved by injecting phosphorus gas into the chamber 10 for about 10-to-30 seconds. During stabilization, phosphorus atoms bind with any excess free indium atoms remaining at the surface to form InP. In the case of either a GaAs or InP workpiece, the injected gas is, for example, introduced into the chamber at a rate that is about the same as that at which arsenic or phosphorus gas is injected during subsequent growth of a layer of GaAs or InP, respectively. During a conventional such subsequent growth cycle, the valves 30 and 32 are open (ON) while the valve 28 is closed (OFF). To grow a GaAs layer, the source 20 is controlled to supply an appropriate gaseous gallium-containing constituent and the source 18 is controlled to supply an appropriate gaseous arsenic-containing constituent, as is well known in the art. Similarly, to grow InP, the source 20 is controlled to supply an appropriate gaseous indium-containing constituent and the source 18 is controlled to supply an appropriate gaseous phosphorus-containing constituent, as is also well known in the art.

Subsequent to the growth cycle carried out in the chamber 10, one or more additional conventional fabrication steps are typically performed outside the chamber 10 to process the workpiece to form a specified device structure. Illustratively, these additional steps comprise such standard operations as photolithography, etching, metalization, dicing, packaging and testing.

Finally, it is to be understood that the above-described techniques are only illustrative of the principles of the present invention. In accordance with those principles, numerous modifications and alternatives may be devised by those skilled in the art without departing from the spirit and scope of the invention. Thus, for example, during each interruption in the pulsed etching cycle, it is feasible to introduce constituents into the chamber 10 from the sources 18 and 20 to cause a layer of the material being etched to be grown on the surface of the workpiece. The thickness of the layer grown during each such interruption is controlled to be less than the thickness removed by etching in each of the immediately prior and subsequent etching periods. In practice, the result of these growing steps interleaved between the etching intervals is to enhance the final smoothness of the etched surface.

What is claimed is:

1. A method of fabricating a semiconductor device, comprising the steps of:
   providing in a reactor a workpiece that includes a surface portion made of a compound III/V semiconductor material,
   etching said surface portion in a pulsed mode that includes spaced-apart intervals during which a gas containing an etchant species is introduced into said reactor, each such etching interval being followed by an interval during which the introduction of said gas into the reactor is interrupted, introducing into said reactor during each etching interval a gas that contains a Group III constituent capable of migrating along surface portions of said material,
   and, following said pulsed-mode etching, growing on said etched surface portion in situ in said same reactor a layer of a semiconductor material.

2. A method as in claim 1 wherein the pressure within said reactor during etching is maintained at about 0.0001 Torr.

3. A method as in claim 2 wherein said etchant species comprises chlorine.

4. A method as in claim 3 wherein the gas containing said etchant species comprises a gas selected from the group consisting of $AsCl_3$, $Cl_2$, HCl and $PCl_3$.

5. A method as in claim 4 wherein the gas containing said etchant species is introduced into said reactor during said etching intervals to produce an etching rate of about 0.1-to-3 micrometers per hour.

6. A method as in claim 5 wherein the Group III constituent capable of migrating along surface portions of said material comprises indium.

7. A method as in claim 6 wherein the indium-containing gas is introduced into said reactor at a rate that is approximately up to about 0.4 times that of the rate at which the etchant-species-containing gas is introduced therein.

8. A method as in claim 7 wherein each of the interruption intervals in said pulsed mode is about 5 seconds long.

9. A method as in claim 8 wherein said semiconductor material is selected from the group consisting of GaAs and InP.

10. A method as in claim 9 wherein said semiconductor material comprises GaAs and the temperature within said reactor in the vicinity of said surface portion is maintained at a value in the range of about 500-to-650 degrees Celsius.

11. A method as in claim 10 wherein said temperature is maintained at a value of about 550 degrees Celsius.

12. A method as in claim 9 wherein said semiconductor material comprises InP and the temperature within said reactor in the vicinity of said surface portion is maintained at a value in the range of about 500-to-600 degrees Celsius.

13. A method as in claim 12 wherein said temperature is maintained at a value of about 520 degrees Celsius.

14. A method as in claim 9 wherein the introduction of said indium-containing gas into the reactor is terminated at least several seconds before the end of the last etching interval in said pulsed mode.

15. A method as in claim 14 wherein, after the termination of the last etching interval and before growth of a layer on the etched surface portion commences, a gas containing a Group III constituent is introduced into said reactor to stabilize said surface portion.

16. A method as in claim 15 wherein, during each interval in the pulsed mode in which etchant species is not introduced into said reactor, gaseous constituents are introduced into the reactor to grow on said surface portion a layer of semiconductor material whose thickness is less than the thickness of material etched in each of the immediately preceding and subsequent etching intervals.

17. A method as in claim 16 wherein said reactor comprises a CBE reactor.

* * * * *